United States Patent [19]

Preuss et al.

[11] 4,121,259

[45] Oct. 17, 1978

[54] METHOD FOR DIGITAL RUN-LENGTH CODING WITH REDUNDANCE REDUCTION FOR TRANSMISSION OF BINARILY CODED PICTURE INFORMATIONS

[75] Inventors: Dieter Preuss, Berenbostel; Peter Segin, Hanover, both of Germany

[73] Assignee: Dr.-Ing. Rudolf Hell GmbH, Germany

[21] Appl. No.: 744,341

[22] Filed: Nov. 23, 1976

[30] Foreign Application Priority Data

Nov. 25, 1975 [DE] Fed. Rep. of Germany ....... 2552751

[51] Int. Cl.² .................. H03K 13/24; H04L 3/00; H04N 1/40; H04N 7/12
[52] U.S. Cl. .......................... 358/261; 340/347 DD
[58] Field of Search ................. 358/261; 340/347 DD

[56] References Cited

U.S. PATENT DOCUMENTS

| 3,560,639 | 2/1971 | Centanni | 358/261 |
| 3,739,085 | 6/1973 | Rosen | 358/261 |
| 3,748,379 | 7/1973 | Epstein | 358/261 |
| 3,830,965 | 8/1974 | Beaudette | 358/261 |

Primary Examiner—Howard W. Britton

Attorney, Agent, or Firm—Hill, Gross, Simpson, Van Santen, Steadman, Chiara & Simpson

[57] ABSTRACT

Method for the digital run-length coding with redundance reduction for the transmission of binary-coded picture information, whereby short code words are assigned to run lengths which occur often, and long code words are assigned to rare run lengths and whereby, from a given run length on, a prefix word for the differentiation of code words of the shorter run-lengths is assigned to the run-lengths, as well as a code word following the prefix word and stating the respective run-lengths as a binary number. Black and white run-lengths which are transmitted by a code word are associated with different code words, depending on how often they occur. The given run-length, from which the coding is to be done with the help of a prefix word, is different for black and white run-lengths. An individual code word is transmitted at the beginning of a line, and it differs from the code words for the individual run-lengths, from the word combination resulting from the prefix word and the subsequent code words, and which does not occur as bit combination of several words or partial words, respectively, in the transmitted data flow.

17 Claims, 8 Drawing Figures

| white lengths | | black lengths | |
|---|---|---|---|
| run length | code | run length | code |
| 1 | 1110 | 1 | 0 |
| 2 | 10 | 2 | 10 |
| 3 | 01 | 3 | 1100 |
| 4 | 110 | 4 | 1101 |
| 5 | 00001 | 5 | 1110 |
| 6 | 00010 | 6 | 11110 |
| 7 | 00011 | 7 | 1111100 |
| 8 | 00100 | 8 | 1111101 |
| 9 | 001010 | 9 | 1111110 |
| 10 | 001011 | 10 | 11111110 |
| 11 | 0011000 | >10 | 11111111 xxxxxxxxx |
| 12 | 0011001 | | binary number >10 |
| 13 | 0011010 | | |
| 14 | 00110110 | | |
| 15 | 00110111 | | |
| 16 | 00111000 | | |
| 17 | 00111001 | | |
| 18 | 00111010 | | |
| 19 | 001110110 | | |
| 20 | 001110111 | | |
| 21 | 001111000 | | |
| 22 | 001111001 | | |
| 23 | 001111010 | | |
| 24 | 001111011 | | |
| 25 | 001111100 | | |
| 26 | 001111101 | | |
| 27 | 001111110 | | |
| 28 | 0011111110 | | |
| 29 | 00111111110 | | |
| 30 | 001111111111 | | |
| >30 | 1111 xxxxxxxxx | | |
| | binary number > 30 | | |
| white line | only line beginning word | | |
| beginning of a line | 00000 0000000000 1 (x) | | | x can be 1 or 0

| white lengths | | black lengths | |
|---|---|---|---|
| run length | code | run length | code |
| 1 | 1110 | 1 | 0 |
| 2 | 10 | 2 | 10 |
| 3 | 01 | 3 | 1100 |
| 4 | 110 | 4 | 1101 |
| 5 | 00001 | 5 | 1110 |
| 6 | 00010 | 6 | 11110 |
| 7 | 00011 | 7 | 1111100 |
| 8 | 00100 | 8 | 1111101 |
| 9 | 001010 | 9 | 1111110 |
| 10 | 001011 | 10 | 11111110 |
| 11 | 0011000 | | |
| 12 | 0011001 | >10 | 11111111 xxxxxxxxx |
| 13 | 0011010 | | binary number >10 |
| 14 | 00110110 | | |
| 15 | 00110111 | | |
| 16 | 00111000 | | |
| 17 | 00111001 | | |
| 18 | 00111010 | | |
| 19 | 001110110 | | |
| 20 | 001110111 | | |
| 21 | 001111000 | | |
| 22 | 001111001 | | |
| 23 | 001111010 | | |
| 24 | 001111011 | | |
| 25 | 001111100 | | |
| 26 | 001111101 | | |
| 27 | 001111110 | | |
| 28 | 0011111110 | | |
| 29 | 00111111110 | | |
| 30 | 00111111111 | | |
| >30 | 1111 xxxxxxxxx binary number >30 | | |
| white line | only line beginning word | | |
| beginning of a line | 00000 0000000000 1 (x) | | | x can be 1 or 0

*Fig. 1*

Coder

Fig. 2a

REG: Register
ROM: Read Only Memory
SR: Shift Register
C: Counter
T: Clock
D: Data Output

REG: Register
ROM: Read Only Memory
T: Clock
P: Indication for Prefix
D: Data Input

METHOD FOR DIGITAL RUN-LENGTH CODING WITH REDUNDANCE REDUCTION FOR TRANSMISSION OF BINARILY CODED PICTURE INFORMATIONS

BACKGROUND OF THE INVENTION

1. Field of the Invention

The invention relates to binary data transmission with redundance reduction.

2. Description of the State of the Art

It is desired for the transmission of binary-coded picture information to save transmission time and band width by using a coding with the help of which the rendundance is reduced which is present in the picture information supplied by the sensor. For this purpose, the so-called run-time coding has been stated in the past, whereby the information of each picture dot is not individually transmitted, but continuous run-lengths of equal information (runs) are transmitted as longitudinally coded digital values (U.S. Pat. No. 2 922 840).

The run-length coding has been improved in the meantime by Huffman in such a way that the coding of the transit lengths is effected with code words of different lengths. The run lengths occurring most often are occupied by the shorter code words, and the run lengths occurring less often are occupied with longer code words, depending on the probability of their occurrence in the picture. With this type of coding, an optimum code can be found, but the electronic expense for the coding and decoding of long code words, which occur seldom but which do occur, cannot be incurred.

As an improvement, a so-called broken Huffman-Code has been described in "IEE International Convention Record" of P. D. Dodd and F. B. Wood, 1963, Pages 60 to 93, whereby the Huffman coding is carried out up to a justifiable run-length. For larger run-lengths, a prefix word with a subsequent code word of constant length with n bits is introduced which states the actual run-length as a binary number. This code has also been stated by W. S. Michel, W. O. Fleckenstein and E. R. Kretzmer in "Wescon Convention Record", 1957, Part 2, Vol. 1, Pages 84 to 93. Thus, a good redundance reaction can be obtained, but the code is very susceptible to disturbance, and a disturbance, which has occurred once, will be carried from line to line, since the decoder does not recognize it.

SUMMARY OF THE INVENTION

The present invention relates to a method for the digital run-length coding with redundance reduction for the transmission of binary-coded picture information, whereby short code words are assigned to frequently occurring run-lengths, and long code words to rare run-lengths, and whereby, from a given run-length on, prefix words, for the differentiation from code words of the shorter run-lengths are assigned to the transit lengths, as well as code words following the prefix words stating the respective run-lengths as binary number.

It is the task of the present invention to improve such a code in such a way that the influence of disturbances of the bit flow is reduced to a minimum during the transmission, faults on the receiving side do not propagate over several lines and pages, and the transmission quality is improved.

It is an object of the invention to assign code words to the black and white run-lengths which are transmitted with a code word, whereby these code words are different, depending on their frequency of occurrence, to make the given run-length, from which the coding is to be effected with the help of a prefix word, different for black and white transit lengths, and to transmit an individual code word at the line beginning, differing from the code words for the individual run-lengths, from the word combinations resulting from the prefix word and the subsequent code words, and also not occurring as bit combination of several words or partial words, respectively, in the transmitted data flow.

It is a further object of the invention to send the individual code word, which is transmitted at the line beginning, for the transmission of a blank line.

It is furthermore an object of the invention that an end word is transmitted at the end of a page or a picture, and it differs from the code words for the individual run-lengths, from the word combinations resulting from the prefix word and the subsequent code words and from the code word transmitted at the line beginning, and does not occur in the transmitted data flow as bit combination of several words or partial words, respectively.

It is a further object of the invention, that the end word triggers a reverse transmission to the sender in the receiver.

Another object of the invention is that, if a fault occurs in a line, this line is left out and is replaced by the preceding line, from its line-beginning word.

Further features of the invention, as well as their advantages, can be taken from the following description, whereby an advantagous sample embodiment is represented, in connection with the attached drawings.

Further changes and variations of the invention are possible without leaving the basic idea and the concept of the invention.

DESCRIPTION OF A PREFERRED EMBODIMENT

Figure 1:
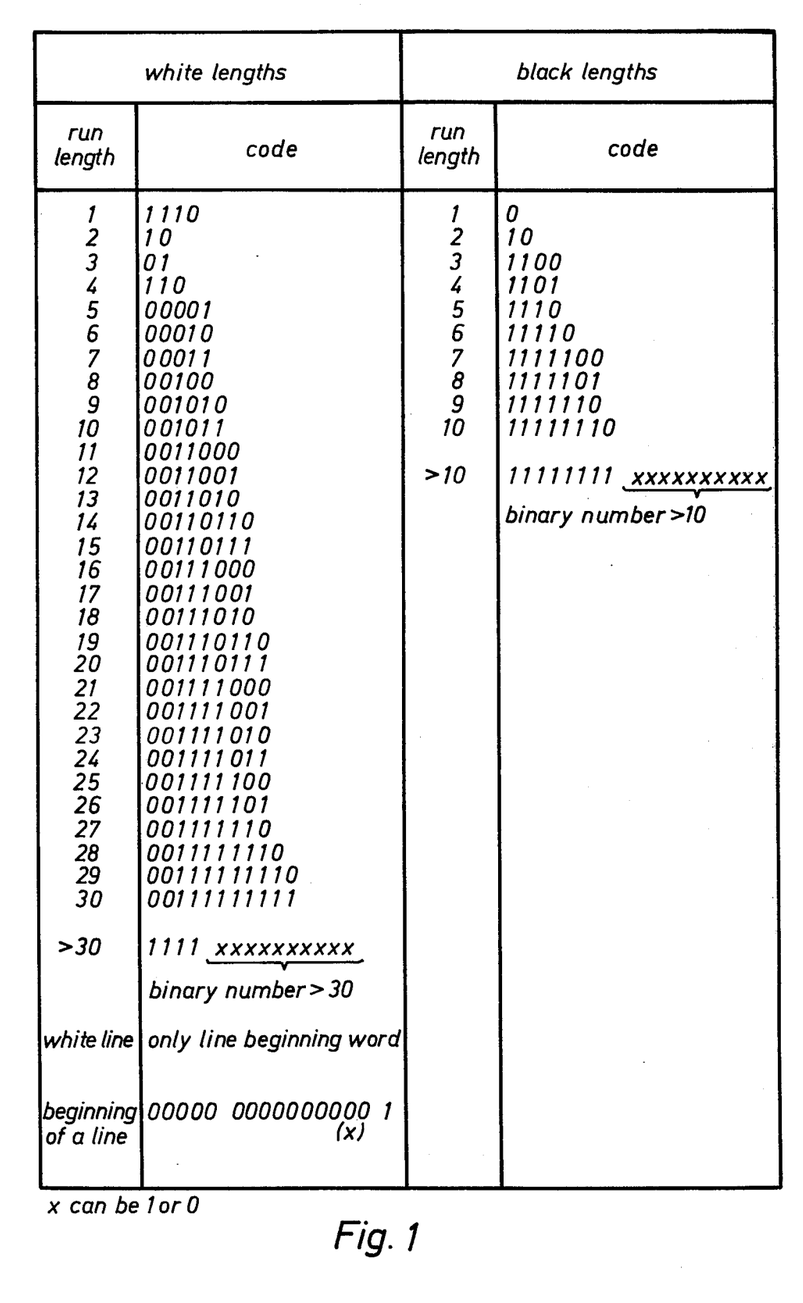
FIG. 1 is a table for an improved Huffman code for black and white run-lengths.

FIG. 1 shows an example of the coding scheme in accordance with the invention for white and black run-lengths, in the form of a table. A pattern which is to be transmitted has been examined with respect to its statistical distribution of black and white run-lengths and, depending on the frequency of occurrence of the individual run-lengths, the run-lengths occurring frequenty have been occupied by short code words, as it is the case with the Morse alphabet. In the case of the black run-lengths, the break was made at the > 10, in the example of FIG. 1, and, in the case of the white run-lengths, at > 30.

For longer run-lengths, in the case of white-value combinations, constant lengths are formed of the prefix 1111 and a subsequent binary number, whereby the actual run-length is stated, and for black values, a prefix 11111111 and also a subsequent binary number is used.

As opposed to the prior-art code, different code words have been selected for equal black and white run-lengths, and the boundary had been determined differently, on the basis of probability.

A line-beginning word is transmitted in order to distinguish the line beginning from the transmitted bit flow. This is similar to the so-called "margin" i.e. margin word of known codes, but is still essentially different therefrom. The prior-art margin word transmitted again for each line, but it is—in the manner of the run-lengths—covered by a code word whose length is positioned between the other code words, depending on its probability. In the case of disturbed data transmission, the drawback will result that the code combination may occur in the data flow if the bit synchronization is disturbed, namely consisting of parts of different other code words or directly of other code words. This will be explained with the help of an example:

| If the margin word is | 1110 |
| the word for run-length 8: | 11 111 |
| The word for the run-length 4: | 110 |

Then the following bit combination may occur if the run-length 8 and 4 are transmitted one after the other: 111 1 [1.110].

In the case of a functioning word synchronization, the words are separately recognized, but if, due to a fault, it is in the wrong timing over one position towards the left, then the encased combination is recognized as a margin word, and the following picture transmission is irreparably disturbed since the mistake propagates over the remainder of the transmission, until the end. Instead of this margin word, however, a line-beginning word is now transmitted at the beginning of each line, selected in such a way that it does not occur in the possible combinations of the successive run-length code or parts of this run-length code. In the code stated in FIG. 1, the word 000000000000001 was selected. As an example, a possible accummulation of zeros had been examined, for instance black run-lengths over 30; 111. 0 000000000, and black run-lenths 5: 00001.

If these two follow one another, the following will result:

111 0000000000 00001.

In the case of a disturbance of the word synchronization, the combination, since it only contains fourteen zeros cannot be recognized as a line-beginning word containing fifteen zeros.

In addition, the line beginning word may also contain a further bit shown in FIG. 1 as "x", in parentheses and signalizing the black or white line beginning as "0" or "1", or oppositely. In the case of the following run-length transmission, the states "black" and "white" then will alternate.

Should, however, the addition of the run-length carried out at the line end for the control of the line length be false, in spite of this selection of the line beginning word, due to an interference, then this line can be left out and be replaced by the preceding one, which is easy in the case of this code, since it operates with intermediate storage. Leaving out the line is better than recording a disturbed line, since the information hardly differs from line to line. The repetition is advantageously started at the line-beginning word of the preceding line. It is also possible to send the same line again.

If a completely white line occurs at some point, the line-beginning word will merely be transmitted, which results in an essential decrease of redundance.

A further improvement can be obtained by way of transmitting an end word at the end of the transmission; it is to be selected in accordance with the same criteria as the line-beginning word, must deviate therefrom, and must also not occur in the bit flow due to a combination of the line-beginning word with other values.

This has the advantage that the transmission of both sides may possibly be ended by a reverse message from the receiver, and no more line costs will occur.

Figures 2, 2B:
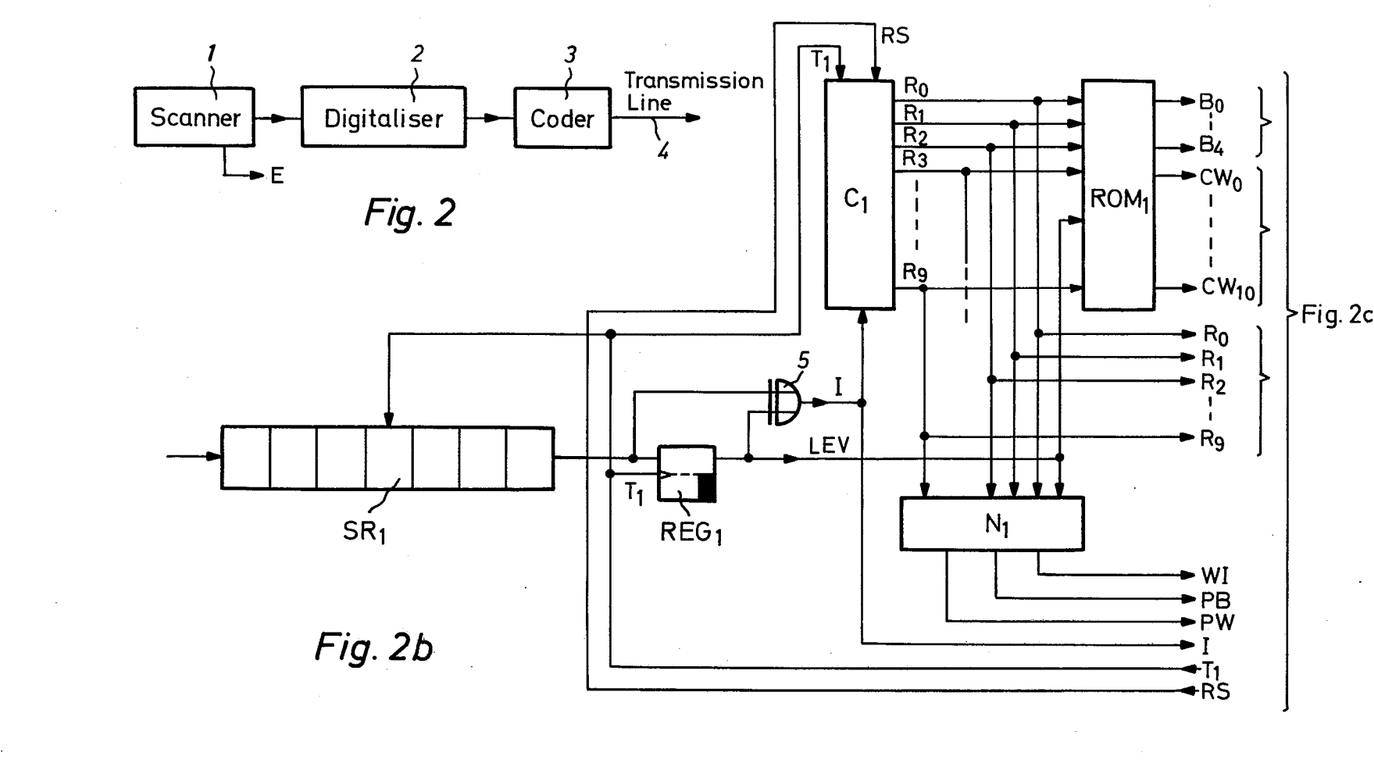
FIG. 2 is a principal circuit diagram of the transmission side.
FIGS. 2b and 2c are a sample embodiment of the coder in accordance with FIG. 2a, FIG. 3 is an example for a part of a code tree for decoding the black transit lengths 1 through 10 of FIG. 1.

FIG. 2 shows a principal circuit diagram of the transmission side. It consists of a common scanner 1, with the help of which a pattern, which is to be transmitted, is opto-electronically scanned. Such scanners have been known for a long time, and the most differing scanners may be used, such as drum scanners, flatbed scanners or flying-spot scanners, as they have been described, for instance, in the book "Fax- The Principles and Practice of Facsimile Communication", Chilton Book Company, New York 1971, Pages 47 through 56.

The analog signals supplied by the scanner 1 is converted into a ditigal picture signal in a digitalizer 2 connected-therebehind, and is processed to a transmission line 4, via coder 3.

In the digitalizer, the analog picture-signal amplitude is given to a threshold-value stage, and it is determined whether the threshold value has been exceeded or not. If the amplitude has been exceeded, the signal is interpreted as white, and if it has not been reached, it is interpreted as black, or vice versa.

In order to obtain the binary data flow, the evaluated signal is timed. This is not shown in detail, since such digitalizers are generally known and have been applied for a long time in the facsimile transmission technology.

Figure 2A:
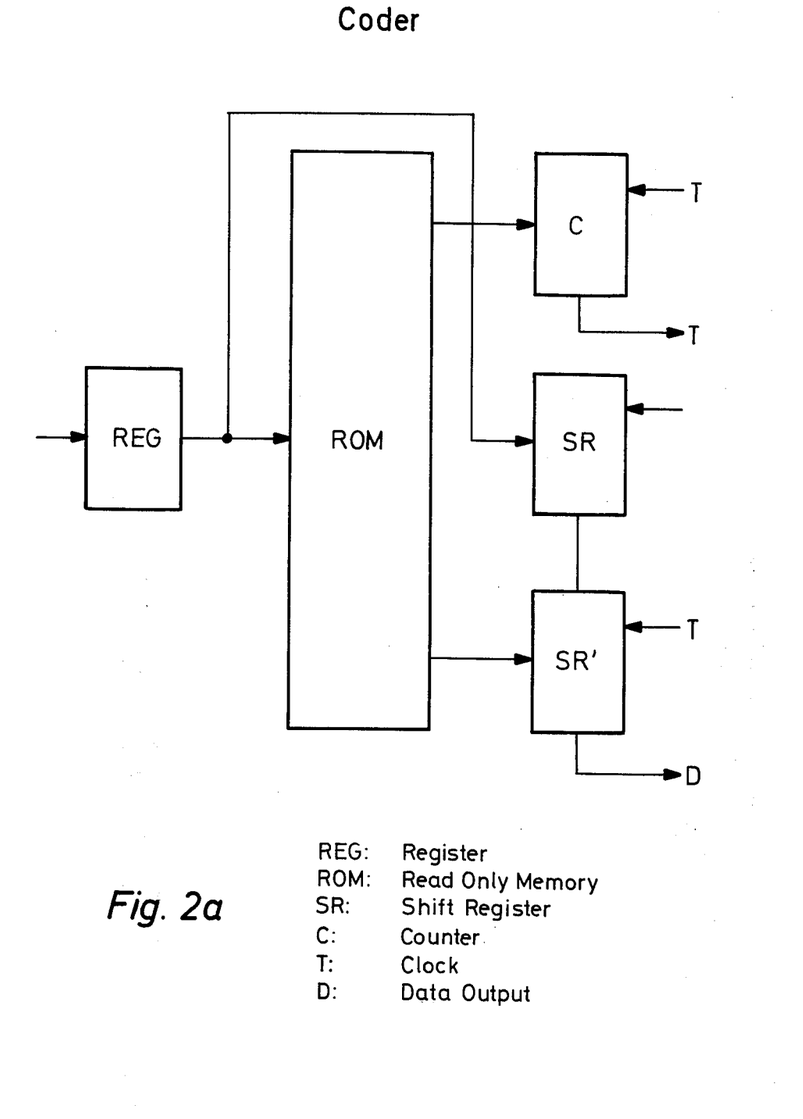
FIG. 2a is a principal circuit diagram of a coder.

FIG. 2a shows a principal circuit diagram of a coder for the coding stated in FIGS. 1 and 2.

In the case of a broken Huffman code, it is not possible to derive the corresponding code word from the run length with the help of a calculation algorithm. The code word can only be obtained by way of searching in a code table in which all given code words are stored.

The memory for the code table may advantageously be realized as memory of the type ROM (read only memory). For a better understanding of the principle of the coder it is to be assumed that a register REG contains the run-lengths, and they are entered as addressed into the memory ROM. The associated code word will appear at the output of the memory ROM, and is written into the shift register SR. Since the code words have different lengths, the length of the code word will also appear at the output of the memory ROM, as a binary number which is written into the reverse counter C. The code word can now be serially shifted out of the shift register SR, for instance to the transmission channel. Simultaneously, the reverse counter will also count the output bits. When the counter has reached the state "zero", the code word is finished.

The run-lengths, which are not contained in the broken Huffman code, are represented by a prefix and a remainder with constant code-word length which contains the binary number of the run-length. If such a run-length occurs, only the prefix will appear at the output of the memroy ROM, as code word, and it is written into the shift register SR'. The run-length is then written into the shift register SR, and the sum of the length of the prefix and the length of the remainder is put into the counter C, as code-word length. Thus, the complete code, consisting of prefix and run-length, can be shifted out of the two shift registers which are switched one behind the other.

Figure 2C:
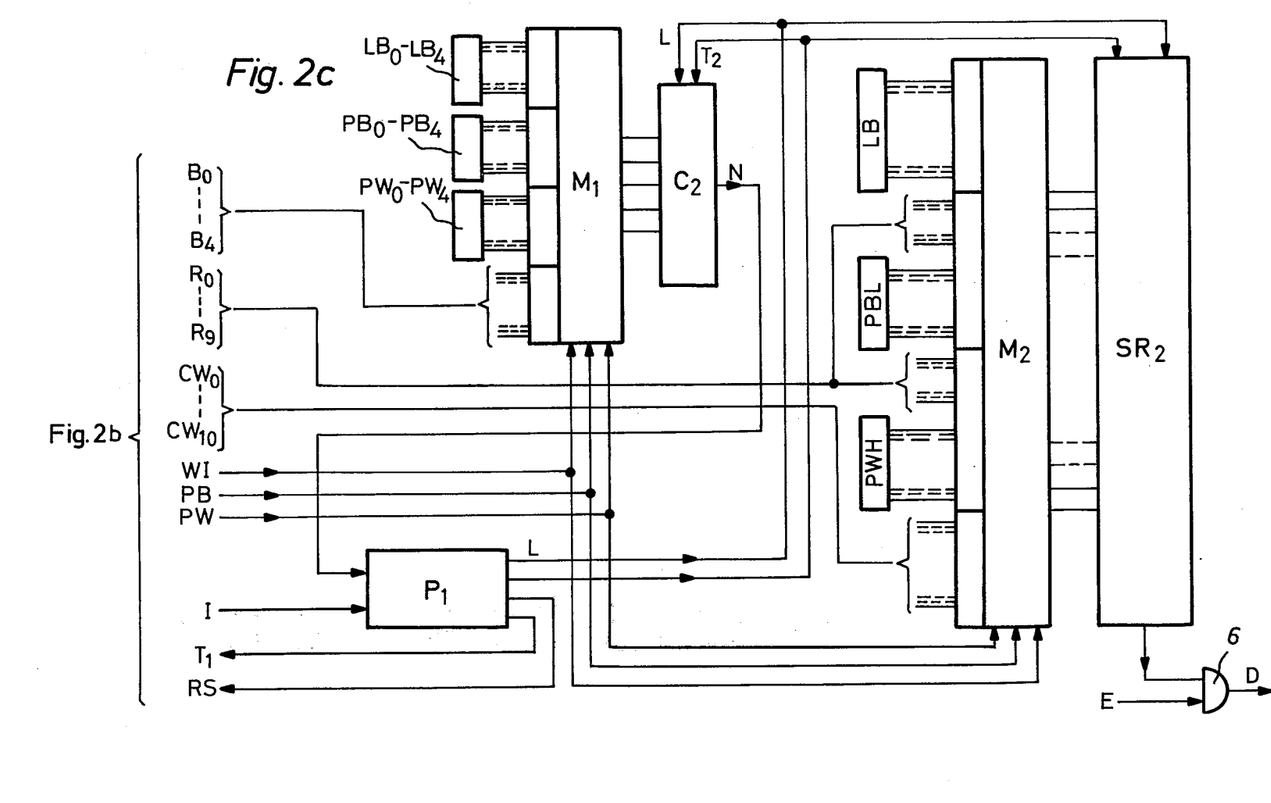

The processes which have just been described, are individually somewhat more complicated, and thus the exact course of action has been shown in FIGS. 2b and 2c, and have been described in the following.

In FIG. 2b, the signal emitted by the digitalizer 2 of FIG. 2 reaches a shift register $SR_1$ which operates as line memory and shifts the picture information in accordance with a given timing $T_1$. In order to obtain the successive run-lengths, the successive black and white junctions are searched, and the number of picture dots in between is determined. Herefore, the picture dots which are present in the shift registers are shifted out dot-by-dot and into the register $REG_1$ wherein the signal is delayed over one timing pulse. The register $REG_1$ may advantageously be a flip-flop or another delay stage. The outputs of the register $REG_1$ and of the shift register $SR_1$ lead towards an exclusive OR gate 5 in which a comparison is done. If there is a difference, it will be indicated at the output I. A difference is given when a black-and-white junction or a white- and black junction occurs, i.e. when the identity of the picture dots changes.

The output I of the OR gate leads towards a counter $C_1$ in which, simultaneously, the number of the picture dots between the black-and-white junctions is also counted in such a way that the number of timing pulses $T_1$ between two signals I, appearing at the output of the gate 5, are counted. The number of picture dots obtained in the counter $C_1$, i.e. the run-length, is placed into the memory $ROM_1$ via the lines $R_0$ through $R_9$ together with the statement of whether a black or white run-length is given, which arrives via the line LEV. The corresponding code word then appears at the output of the memory ROM, at the lines $CW_0$ through $CW_{10}$. For the later evaluation, it is also required to know the length of the code word, and thus it will always be available at lines $B_0$ through $B_4$, respectively. The code words are given to the multiplexor $M_2$ of FIG. 2c, via the line $CW_0$ through $CW_{10}$, and from there the code words reach the shift register $SR_2$ and are emitted to the transmission line D which has been denoted by 4 in FIG. 2. The code word lengths reach a reverse counter $C_2$ via the lines $B_0$ through $B_4$ and the multiplexor $M_1$, and this counter $C_2$ also counts the stated bits with which the code word is emitted onto the data output D from the shift register $SR_2$. The counter counts downward as low as zero, and emits a zero signal N at its output when the code word is shifted out of the shift register $SR_2$ due to the timing $T_2$. The signal N, which appears at the output of the counter and which might also be called a code-word-end signal is emitted as a reset signal for the counter $C_1$ in the timing program control mechanism $P_1$. When a new code word is present in the memory ROM, which is also present at the multiplexor $M_2$, then the program control mechanism $P_1$ emits a load signal L for the counter $C_2$ and the shift register $SR_2$ which causes the new code word to be taken over into the register $SR_2$ and the counter $C_2$.

The timing pulses $T_1$ and $T_2$, which are also emitted by the program control mechanism $P_1$ are time-shifted with respect to one another over such an amount as it is determined by the detection of the run-lengths and the input of the code word into the memory $ROM_1$.

In the broken Huffman-code, the run-lengths are not represented by separate code words, but the run-lengths not contained in the Huffman code are represented by a prefix and a remainder with constant code-word lengths, containing the binary number of the run length. For these cases, a decoding network $N_1$ is provided in FIG. 2b which is supplied with the run-length from the counter $C_1$, via the lines $R_0$ through $R_9$, and the statement of whether a black or a white run-length is given, via the line LEV. The network $N_1$ recognizes such a run-length and emits a signal for a prefix white and a signal for a prefix black which, respectively, reach the multiplexors $M_1$ and $M_2$ of FIG. 2c via lines PW and PB, respectively and set them. The multiplexor $M_2$ has several inputs at which the corresponding code combination for the white and black prefix combinations are present, in a fixed wired manner. This way, for instance for white, be the bit combination PWH and, for black, the combination PBL, which are represented by the component group denoted by prefix PWH and prefix PBL in FIG. 2c, as a fixed combination of zero and one. In the case of this component group, we are concerned with a simple network, which has not been shown in detail and which supplies the potentials for 1 and 0, corresponding to the given bit combination.

Due to the respective reset signal PB and PW, the fixed wired bit combinations of the prefixes for black and white are, respectively, placed into the shift register $SR_2$, namely together with the binary representations of the associated run-lengths which arrive via the lines $R_0$ through $R_9$ from the counter $C_1$. Simultaneously, a fixed wired code-word length, for white, $PW_0$ through $PW_4$ and, for black, $PB_0$ through $PB_4$ is shifted into the reverse counter $C_2$, via the multiplexor $M_1$, which has also been switched over. Thus, the complete code word, consisting of prefix and binary representation of the run-length is shifted out of the shift register $SR_2$, which corresponds to the shift registers SR and SR' of FIG. 2a. If the line-beginning sign is to be coded, the output WI of the network $N_1$ will set the multiplexors. The fixed wired line-beginning word LB is written into the shift register $SR_2$, and the length of the line beginning word $LB_0$ through $LB_4$ into the counter $C_2$. If a completely white line occurs, the output WI of the network $N_1$ will also react, and now only the line beginning word will be coded. The required timings are produced in the program control $P_1$, to control the respective signal-transit times and the time succession of the above-described function procedures.

Furthermore, the transmission of a margin word is of importance. Herefore, the scanner 1 of FIG. 2 has an output whereas a corresponding impulse E will appear, possibly by way of scanning a mark or due to a so-called paper contact.

The line-end word consists of a multitude of zeros, namely of a number which is larger than the other combination of zeros which may occur. For safety reasons, an additional number of zeros is transmitted, so that, even in the case of a disturbance, it is guaranteed that the number of zeros required for the recognition of the side end by the decoder will be recognized. For this reason, an AND gate 6 is connected to the output of the shift register $SR_2$ and to the output E of the scanner. If the end impulse of the scanner 1 is, for instance, given by a paper contact it will supply the value "one" during the scanning process, i.e. 1, the AND gate 6 is permeable and passes all data of the shift register $SR_2$. If the paper is taken out at the end of the scanning process, then the value "out", i.e. 0, will appear at the paper contact, and the AND gate will only emit zeros, namely until the decoder has obtained such a number of zeros which will be recognized as a transmission-end word or side-end word. Different things, such as reverse message, zero positions of coder and decoder, switching off or paper cut on the receiving side are derived from this signal, which, however, is not the subject of the present invention.

Figure 3:
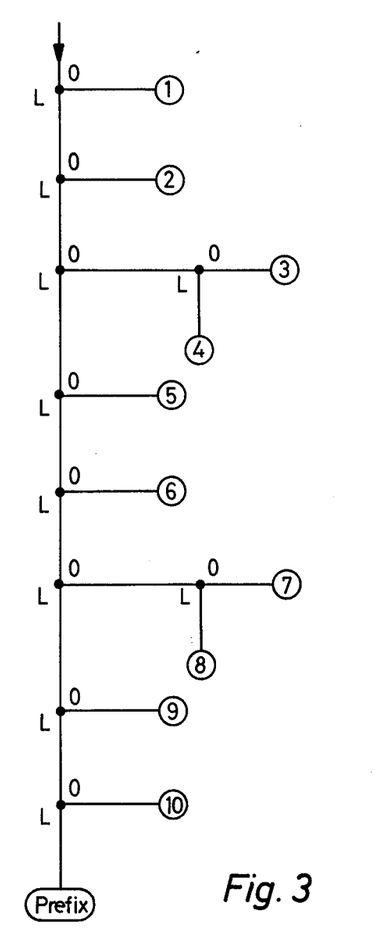

FIG. 3 shows a code tree for the decoding of the code words for the black run-lengths 1 through 10. At each knot a decision about the direction into which the decoding is to continue, will be made. During the decoding process, the end of the code word and the associated run length are to be determined from the serially arriving data. The decoding is effected in such a way that the code tree, which clearly determines each Huffman code, passes from knot to knot, until the end of the code word is reached (compare picture). At each knot which has been passed, the branching is determined by the respective bit of the code word (0 or 1). The realization of the Huffman code simulates this code tree, whereby each knot is associated with a number. When the present knot is known, and if the next code-word bit is also known, then these two pieces of information clearly lead to the next knot.

A decoder operating in accordance with this principle has been shown in FIG. 1. The decoding process can also be realized with a memory of the ROM type, designed similarly as a micro-program control. The number which is associated with the knot, is positioned in a register $REG_a$. In addition, the next code-word bit, which appears at the data input "D", is written into the register. Both pieces of information, which must clearly lead to the next knot, i.e. to the next number, are placed into the memory ROM, as an address. This number appears at the output of the memory ROM, and is now again written into the register $REG_a$, together with the next code-word bit, etc. In this manner, the code tree is travelled through until the code-word end has been reached. The code-word end is indicated at the output CW of the memory ROM. At this moment, the following knot is not stored in the memory ROM, but the decoded run-length, which is written into the register $REG_b$. The register $REG_a$ is, hereafter, again brought into the initial state. If the prefix has been decoded as code word, this will be indicated at output P. In this case, the following data bit do not represent a Huffman code word, but the run-length as $n$ bit binary number. Thus, the next $n$ bits are serially entered into the register $REG_b$. After each decoding, the register $REG_b$ contains the run-length from which the corresponding number of white or black picture dots is produced, by way of counting downwards until zero is reached.

Figure 4:
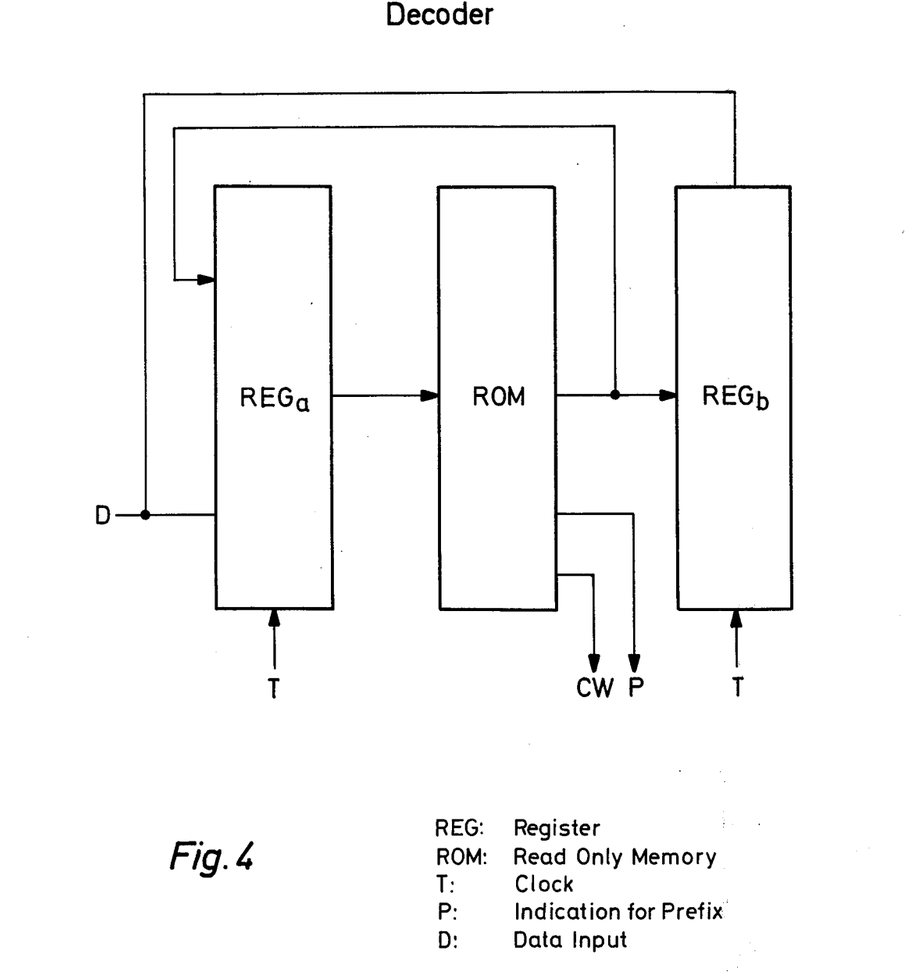
FIG. 4 is a principal circuit diagram of a decoder, FIG. 4a an example of a decoder.
Figure 4A:
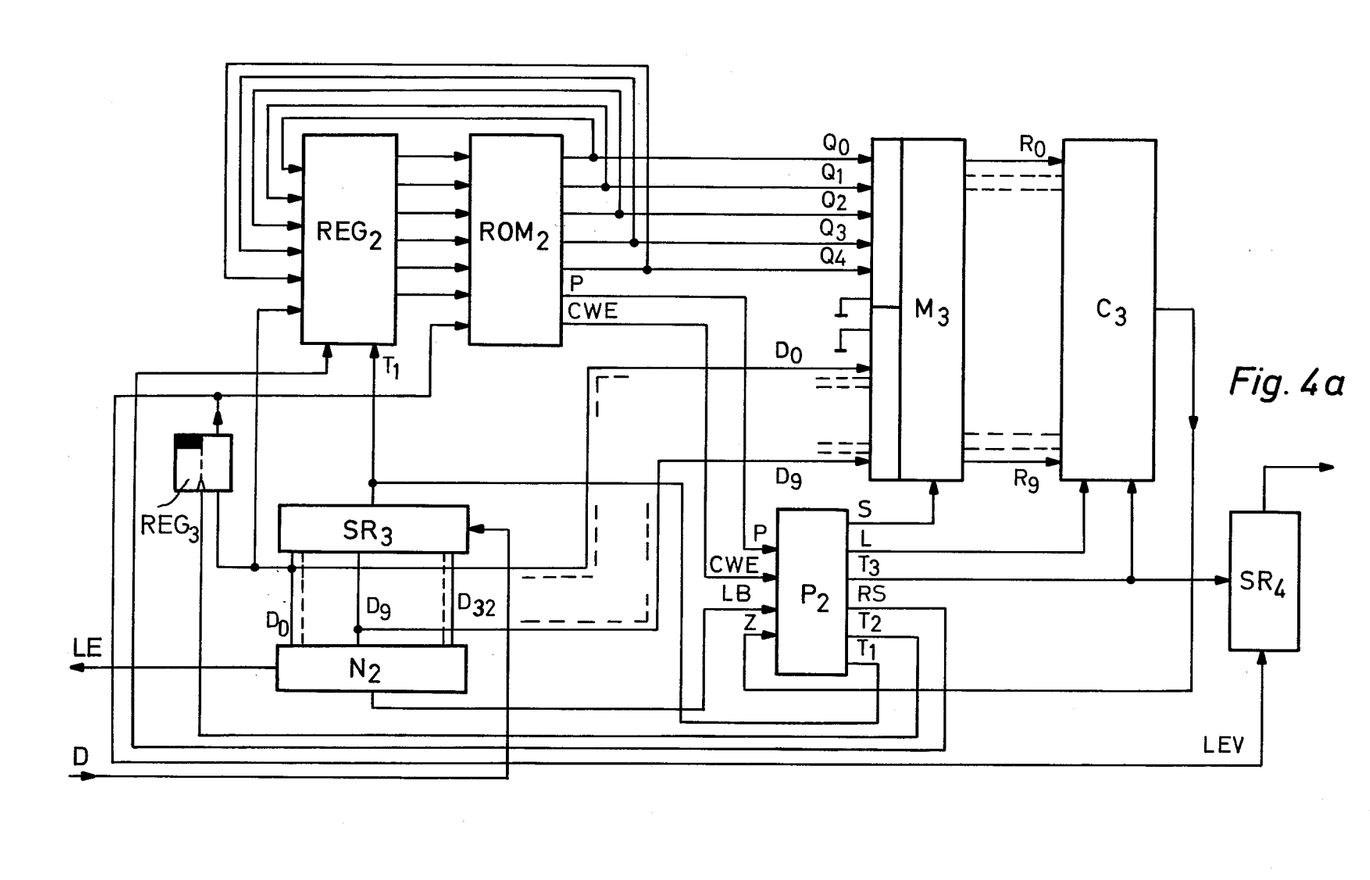

FIG. 4a shows the decoder in more detail, which operates in accordance with this principle. The transmission line of FIG. 2 reaches the data input D of the decoder, via a receiver, which has not been shown, whereby this decoder is connected with a shift register $SR_3$ into which the individual code-word bits $D_0$ through $D_{32}$ can be entered. The bit which, respectively, has been entirely shifted through, reaches a register $REG_2$, via a line $D_0$ associated with this bit, whereby a number is positioned in this register $REG_2$, which is associated with the instantaneous knot of the code tree of FIG. 3. The memory $ROM_2$ for all these numbers is again embodied as memory of the ROM type. The passage of the code tree is now such that the respectively next bit which arrives on the line $D_0$ is entered into the register; from there, it will be placed as address into the memory $ROM_2$ together with the information of whether black or white are concerned. The information of whether black or white is concerned, is obtained via a register $REG_3$, which may be a flip-flop and which is connected to the line $D_0$. The number associated with the corresponding knot of the code tree appears at the output $Q_0$ through $Q_4$ of the memory $ROM_2$ and is again processed to the input of the $REG_2$ via these lines, is there entered into the memory $ROM_2$ together with the next bit arriving via line $D_0$, again as address which will cause within the memory that the number, which is associated with the next knot, is emitted and again transferred into the register $REG_2$. In this manner, the code tree is travelled through, until the code word end has been reached. The code-word end is indicated at the output CWE of the memory $ROM_2$. At this moment, the next knot is not stored in the memory $ROM_2$, but the decoded run-length, in a binary representation, which is entered into a reverse counter $C_3$, via the lines $Q_0$ through $Q_4$ and the multiplexor $M_3$. The register $REG_2$ is thereafter again brought into the initial state, via the reset impulse RS.

If the prefix has been decoded as code word, this will be indicated at output P. In this case, the next data bits at lines $D_0$ through $D_9$ do not represent a Huffman code word, but the run-length as a binary number. Thus, these bits are written into the reverse counter $C_3$ via the multiplexor $M_3$, which has been switched over due to the line S. For the writing-in process into the reverse counter, a load impulse L is derived, which has been emitted by the timing program control mechanism $P_2$ and derived either from the code word or due to the recognition that one is concerned with a prefix. Herefore, the lines CWE and P are processed through the timing-program control mechanism $P_2$ in which they are correspondingly delayed. In the same manner, the switch impulse at line S is obtained for the multiplexor $M_3$. It should be noted that this multiplexor, in the same manner as the multiplexors $M_1$ and $M_2$, is merely a switch which switches over multiple lines.

After the input of the binary representation of the run-legnth, via the lines $D_0$ through $D_9$ into the reverse counter $C_3$, the corresponding number of white and black picture dots is written into a line memory $SR_4$, by way of counting down until "zero" is reached. The indicator impulse of the counter state "zero" appears at its output and is processed to the timing-control mechanism $P_2$.

The register $REG_3$ always contains the instantaneous color of the run-length, white or black. At the beginning of a line, the first data bit, which represents the color of the first run-length, is written into the register $REG_3$. After the decoding of a code word, the color of the run-length will change, the register $REG_3$ will be switched over by the timing $T_2$.

Due to the shift register $SR_3$, the arriving data stream is shifted through as soon as the line-beginning word has arrived in the shift register $SR_3$, the indication "line beginning" is effected via the network $N_2$ and is processed towards the timing control $P_2$ via the line LB. The side-end word transmitted at the end of the transmission is also decoded by the network $N_2$ and emitted to line LE.

We claim as our invention:

1. The method for digital run-length coding with redundancy reduction for the transmission of binary coded picture information which is derived by electro-optically scanning a picture original line by line converting the derived picture signals in run-lengths of black and white picture information, assigning to said run-lengths binary code words of different lengths which are transmitted over a transmission channel and are decoded at the receiver, obtaining the transmitted code words by searching in a code word table in which all occurring code words are stored and where short code words are assigned to frequently occurring run-lengths, and longer code words are assigned to rarely occurring run-lengths, assigned from a predetermined run-length a prefix word to the respective run-length and transmitting the combination of the prefix and the respective run-length as a binary number, the improvement comprising the steps of choosing different predetermined run-lengths for the black and white run-length from which the black and white run-lengths are transmitted as bit combination of two different prefix words and the respective black and white run-lengths, transmitting at the beginning of a line an individual code word which differs from the code words for the individual run-lengths, the word combination resulting from the prefix words and the respective run-length and which does not appear in the transmission data flow as a bit combination of several words or partial words, respectively.

2. The method according to claim 1 comprising the steps of transmitting at the end of the scanning of a picture an end word, which is different from the code words for the individual run-lengths, the word combinations resulting from the prefix words and the respective run-lengths, the code word transmitted at the line beginning and which does not appear in the transmission data flow as a bit combination of several words or a partial word, respectively.

3. The method according to claim 1 comprising the steps of omitting a line at the receiver if a fault has occurred during transmission and replacing the omitted line at the receiver by the preceding line.

4. The method according to claim 3 comprising the steps of omitting a line at the receiver if a fault has occurred during transmission and replacing the omitted line at the receiver by the preceding line.

5. The method according to claim 1 comprising the step of assigning to the code word which is transmitted at the beginning of a line an additional bit for determining whether the beginning of the line is black or white.

6. The method according to claim 5 comprising the steps of transmitting at the end of the scanning of a picture an end word, which is different from the code words for the individual run-lengths, the word combinations resulting from the prefix words and the respective run-lengths the code word transmitted at the line beginning, and which does not appear in the transmission data flow as a bit combination of several words or a partial word, respectively.

7. The method according to claim 5 comprising the steps of omitting a line at the receiver if a fault has occurred during transmission and replacing the omitted line at the receiver by the preceding line.

8. The method according to claim 1 comprising the step of transmitting in the case of a blank line only the individual code word which is transmitted at the beginning of a line.

9. The method according to claim 8 comprising the steps of omitting a line at the receiver if a fault has occurred during transmission and replacing the omitted line at the receiver by the preceding line.

10. The method according to claim 8 comprising the steps of transmitting at the end of the scanning of a picture an end word, which is different from the code words for the individual run-lengths, the word combinations resulting from the prefix words, and the respective run-lengths the code word transmitted at the line beginning, and which does not appear in the transmission data flow as a bit combination of several words or a partial word, respectively.

11. The method according to claim 10 comprising the steps of omitting a line at the receiver if a fault has occurred during transmission and replacing the omitted line at the receiver by the preceding line.

12. The method according to claim 5 comprising the step of transmitting in the case of a blank line only the individual code word which is transmitted at the beginning of a line.

13. The method according to claim 12 comprising the steps of omitting a line at the receiver if a fault has occurred during transmission and replacing the omitted line at the receiver by the preceding line.

14. The method according to claim 12 comprising the steps of transmitting at the end of the scanning of a picture an end word, which is different from the code words for the individual run-lengths, the word combinations resulting from the prefix words, and the respective run-lengths the code word transmitted at the line beginning and which does not appear in the transmission data flow as a bit combination of several words or a partial word, respectively.

15. The method according to claim 14 comprising the steps of omitting a line at the receiver if a fault has occurred during transmission and relacing the omitted line at the receiver by the preceding line.

16. The method according to claim 14 comprising the step of transmitting a reverse message from the receiver to the transmitter when the end of line word is received.

17. The method according to claim 16 comprising the steps of omitting a line at the receiver if a fault has occurred during transmission and replacing the omitted line at the receiver by the preceding line.

* * * * *